United States Patent [19]
Choquette et al.

[11] Patent Number: 5,559,053
[45] Date of Patent: Sep. 24, 1996

[54] VERTICAL CAVITY SEMICONDUCTOR LASER

[75] Inventors: Kent D. Choquette, Albuquerque, N.M.; Robert S. Freund, Livingston, N.J.; Minghwei Hong, Watchung, N.J.; Daryoosh Vakhshoori, Chatham Township, Morris County, N.J.

[73] Assignee: Lucent Technologies Inc., Murray Hill, N.J.

[21] Appl. No.: 468,574

[22] Filed: Jun. 6, 1995

Related U.S. Application Data

[62] Division of Ser. No. 227,419, Apr. 14, 1994, abandoned.

[51] Int. Cl.$^6$ .................................................. H01L 21/20
[52] U.S. Cl. .................................. 437/129; 148/DIG. 95
[58] Field of Search ..................... 437/129; 148/DIG. 95

[56] References Cited

U.S. PATENT DOCUMENTS

| | | | |
|---|---|---|---|
| 4,999,843 | 3/1991 | Luryi et al. | 372/45 |
| 5,034,958 | 7/1991 | Kwon et al. | 372/45 |
| 5,208,821 | 5/1993 | Berger et al. | 372/48 |
| 5,212,702 | 5/1993 | Choquette | 372/45 |
| 5,258,316 | 11/1993 | Ackley et al. | 437/24 |
| 5,317,587 | 5/1994 | Ackley et al. | 372/45 |
| 5,348,912 | 9/1994 | Choquette et al. | 437/129 |

OTHER PUBLICATIONS

K. D. Choquette et al., "Vertical–Cavity Surface–Emitting Laser Diodes Fabricated by Vacuum Integrated Processing," *IEEE Photonics Tech. Lett.*, vol. 4, No. 9, Sep. 1992, pp. 951–995.

K. D. Choquette et al., "Vertical–Cavity Surface–Emitting Laser Diodes Fabricated by in Situ Dry Etching and Molecular Beam Epitaxial Regrowth," *IEEE Photonics Tech. Lett.*, vol. 5, No. 3, pp. 284–287, Mar. 1993. Comments: Reference AA, together with its problems, are discussed in the specification of the present invention (p. 1, line 26 over to p. 2, line 15).

M. Hong et al., "Vacuum Integrated Fabrication of Buried Heterostructure Edge Emitting Laser Diodes," *Mat. Res. Soc. Symp. Proc.*, vol. 300, pp. 189–196, Jun. 1993. Comments: Reference AB (especially at p. 189, last paragraph) furnishes background of the present invention, regarding the issue of mesa (cavity) lateral size, as is mentioned in the specification of the present invention (p. 1, lines 23–25). This reference AB also describes a laser mesa structure with an epitaxial III–V semiconductor sidewall layer; but in this reference AB, the top metallic electrode layer does not and cannot contact the entire top surface of the mesa structure as it does in the present invention as claimed (claim 1, lines 8–9).

*Primary Examiner*—Robert Kunemund

[57] ABSTRACT

This invention involves a vertical cavity surface emitting laser ("VCSEL") having a Group III–V semiconductor epitaxial mesa structure with an electrically insulating sidewall located on the mesa's sidewalls for confinement of the optical radiation generated in the laser. A suitably doped Group III–V epitaxial layer or a layer of insulating material such as silicon dioxide acts as the insulating sidewall layer. Advantageously, the structure has a self-aligned ohmic contact layer located everywhere on the top surface of the epitaxial mesa structure.

8 Claims, 2 Drawing Sheets

VERTICAL CAVITY SEMICONDUCTOR LASER

This is a division of application Ser. No. 08/227,419 filed Apr. 14, 1994 now abandoned.

FIELD OF THE INVENTION

This invention relates to semiconductor lasers and in particular to semiconductor vertical cavity surface emitting lasers ("VCSELs"). Methods for making such lasers are also described.

BACKGROUND OF THE INVENTION

Semiconductor lasers are attractive for a wide variety of applications including telecommunications, computing systems, optical recording systems and optical interconnection of integrated circuits. Semiconductor lasers provide compact sources of coherent, monochromatic light which can be modulated at high bit rates to transmit large mounts of information.

Vertical-cavity surface emitting lasers are particularly promising for applications requiring two dimensional arrays of lasers. As contrasted with edge emitting lasers which emit light parallel to the semiconductor growth planes of their substrates, VCSELs emit light perpendicular to growth planes. A typical VCSEL comprises an active semiconductive region sandwiched between a pair of distributed semiconductive Bragg reflectors. Upon injection of suitable current through the active region, laser light is transmitted perpendicular to the growth planes.

An important feature for VCSELs in laser applications requiring optical fiber coupling or low noise performance is single-mode operation with high output power ($\geq 1$ mW). Typically VCSELs operate in a single longitudinal mode owing to their short cavity length; however, optical emission in a higher-order transverse mode is common at modest output power, and can be multimode at high power. To achieve and ensure single transverse mode operation, an approximate cavity diameter of $\geq 5$ µm is desirable if not required.

In a paper entitled "Vertical-Cavity Surface-Emitting Laser Diodes Fabricated by In Situ Dry Etching and Molecular Beam Epitaxial Regrowth" written by Kent D. Choquette et at. and published in *IEEE Photonics Technology Letters*, Vol. 5, No. 3, pp. 284–287, a method was described for fabricating lasers having mesa-type structures. In that method, a Group III-V semiconductor laser mesa structure is fabricated by first forming a III-V mesa structure on a III-V semiconductor substrate, followed by forming by means of molecular beam epitaxy an epitaxial sidewall layer at a time when the top surface of the III-V mesa structure is protected by a sacrificial layer of silicon dioxide. One of the purposes of the epitaxial sidewall layer is to provide a relatively defect-free sidewall for confining laterally the optical radiation generated in the laser structure.

During the molecular beam epitaxy of the epitaxial sidewall layer, a polycrystalline ("non-epitaxial") layer of the Group III-V semiconductor material being deposited on the sidewall also forms on the top surface of the mesa. This polycrystalline layer and the sacrificial layer of silicon dioxide must be removed in order to enable an ohmic contact layer to be attached to the top surface of the epitaxial mesa structure. The removal of this polycrystalline layer, in turn, requires a separate lateral alignment step to align an aperture in a photoresist layer through which the required removal of the polycrystalline layer (by means of reactive ion etching) is performed. Owing to lateral misalignment errors in forming the aperture in the photoresist layer, it is difficult to achieve mesa diameters of as small as approximately 5 µm using the method described in that paper. Moreover, the electrical resistivity of the epitaxial sidewall layer may be insufficient to prevent an undesirably large amount of power dissipation caused by leakage current to the substrate—i.e., caused by leakage current between a wiring layer (located on the top surface of the structure) and an electrical contact to the substrate.

It would therefore be desirable to have a method for fabricating small-diameter lasers that is more easily controllable and that can, if desired, reduce the leakage current.

SUMMARY OF THE INVENTION

This invention mitigates the foregoing problem by using a resist lift-off procedure in addition to using the above-described protective masking layer located on the polycrystalline layer, whereby a self-aligned ohmic contact layer can be formed on the top surface of the mesa structure. In addition, if an epitaxial sidewall layer located along a sidewall of the mesa structure is not sufficiently electrically resistive to prevent undesirably high leakage currents to the substrate and hence undesirably high power loss, then an electrically insulating sidewall layer can be added to the structure.

In a specific embodiment of the invention, a laser structure includes:

(a) a substrate including a top layer of epitaxial III-V semiconductor;

(b) an epitaxial III-V semiconductor mesa structure, located on the top layer of the substrate, having a top surface and being suitable for supporting vertical laser operation therein;

(c) an epitaxial semiconductor sidewall layer located on a sidewall of the mesa structure; and (d) a metal or metal-like electrode layer contacting the entire top surface of the epitaxial mesa structure.

In another embodiment, the invention involves the foregoing laser structure in which the mesa structure further includes an electrically insulating layer located on the epitaxial sidewall layer.

In all embodiments, it is advantageous that the mesa structure comprises:

a first mesa layer comprising epitaxial III-V semiconductor material, having a first conductivity type and being located overlying and in physical contact with a top surface of the substrate;

a second mesa layer comprising epitaxial III-V semiconductor material, having a p-n junction therein and being located overlying and in physical contact with a top surface of the first mesa layer; and a third mesa layer comprising epitaxial III-V semiconductor material, having a second conductivity type that is opposite from the first type and being located overlying and in physical contact with a top surface of the second mesa layer.

It is further advantageous in all embodiments that both the first mesa layer and the third mesa layer include distributed feedback Bragg reflectors.

The invention also provides a method for making laser structures including the steps of:

(a) forming an epitaxial III-V semiconductor structure on a III-V semiconductor monocrystalline substrate;

(b) forming a localized protective masking layer on a top surface of the epitaxial III-V semiconductor structure;

(c) etching a first thickness of the semiconductor structure whereby an epitaxial III-V semiconductor mesa structure is formed and whereby either a second thickness of a laterally extended portion of the epitaxial layer remains intact or a laterally extended portion of a top surface of the substrate is exposed;

(d) simultaneously forming an epitaxial sidewall layer on a sidewall surface of the epitaxial mesa structure and an epitaxial bottom layer of a III-V semiconductor material either on an exposed top surface of the second thickness of the epitaxial layer or on the exposed top surface of the laterally extended portion of the substrate;

(e) forming a planarized patterned resist layer on the epitaxial sidewall and epitaxial bottom layers but not on the non-epitaxial layer;

(f) entirely removing the protective masking layer from the top surface of the epitaxial mesa structure without entirely removing the epitaxial sidewall layer and without entirely removing the planarized patterned resist layer, whereby the entire top surface of the epitaxial mesa structure is exposed;

(g) depositing a metal or metal-like layer on the entire exposed top surface of the epitaxial mesa structure and on the top surface of the planarized patterned resist layer, and removing the metal or metal-like layer by a resist lift off process, whereby a localized metal or metal-like layer remains intact on the top surface of the epitaxial mesa structure.

During step (d) a non-epitaxial layer of the III-V semiconductor material ordinarily will form automatically, in which case this non-epitaxial layer is removed during step (f).

The method advantageously further comprises simultaneously depositing, subsequent to step (g), another metal or metal-like layer on the localized metal or metal like layer, on the epitaxial sidewall layer, and on the top surface of the second thickness of the epitaxial layer.

The method also advantageously further comprises, subsequent to the above-recited step (g), the steps of:

depositing an electrically insulating layer simultaneously on a top surface of the localized metal or metal-like layer and on the epitaxial sidewall and the epitaxial bottom layers;

forming a second patterned planarized resist layer on the electrically insulating layer but not on those portions thereof overlying the localized metal or metal-like layer;

removing that portion of the electrically insulating layer that overlies the localized metal or metal-like layer; and removing the second patterned planarized resist layer.

Only for the sake of clarity, none of the drawings is to scale.

DETAILED DESCRIPTION

Figure 1:
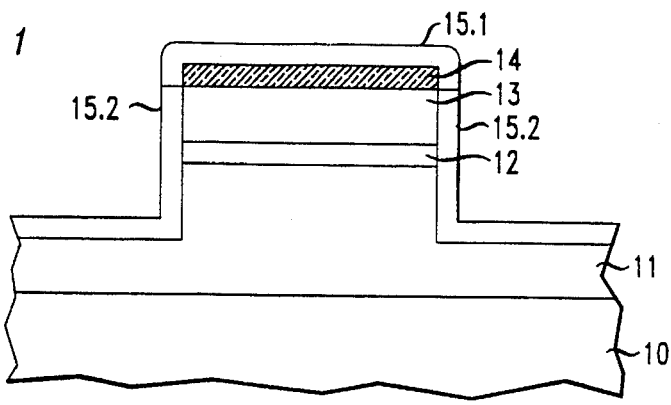
FIGS. 1–5 are cross-sectional diagrams of successive stages of a laser structure being fabricated in accordance with a specific embodiment of the invention.

As shown in FIG. 1, a monocrystalline substrate 10 supports an epitaxial layer 11. As a result of being doped with silicon to a concentration of typically approximately $2 \times 10^{18}$ (=2 E 18) silicon nuclei per cubic centimeter, the substrate 10 is typically n-type gallium arsenide. As further indicated (FIG. 1), the epitaxial layer 11 has a laterally extended portion as well as a mesa portion. The diameter of the mesa portion of the epitaxial layer 11 is typically approximately 5 μm or less.

The epitaxial layer 11 typically comprises alternating layers of epitaxial aluminum arsenide, each approximately 25 nm thick, and epitaxial gallium arsenide, each approximately 30 nm thick. Each of these alternating aluminum arsenide and gallium arsenide epitaxial layers typically has n-type conductivity, and typically is separated from its neighbor by a linearly-graded-composition layer comprising n-type aluminum gallium arsenide having a thickness of typically approximately 50 nm. The mesa portion of the epitaxial layer 11 supports an epitaxial layer 12 (hereinafter: "active region 12") having a solely mesa structure, typically comprising four layers of gallium arsenide, each approximately 12 nm thick, alternating with three layers of indium gallium arsenide, each approximately 10 nm thick. The conductivity type of these four layers of gallium arsenide typically is slightly p-type; the conductivity type of these three layers of indium gallium arsenide typically is also slightly p-type.

Figure 5:
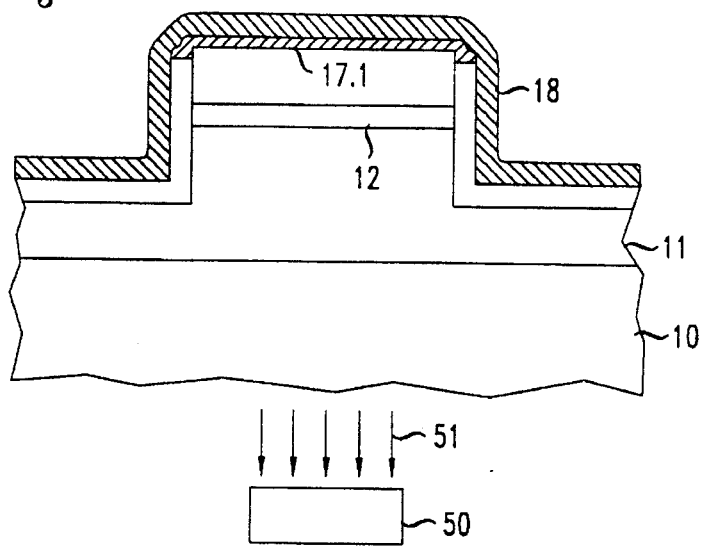
Figure 7:
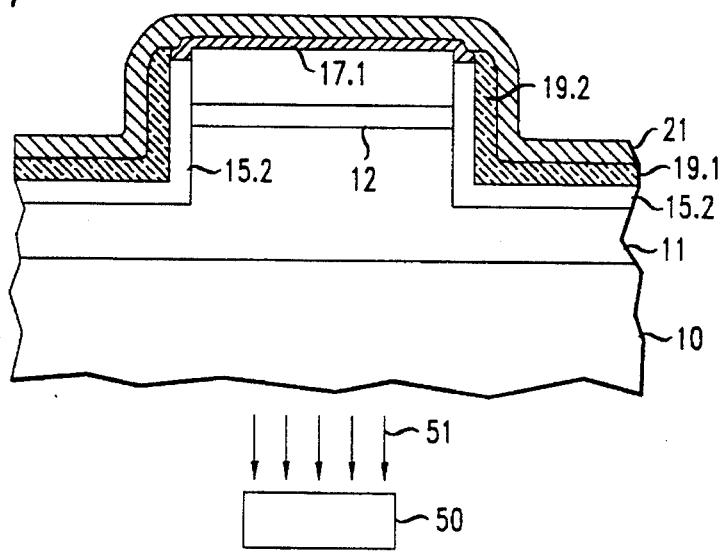

On top of the active region 12 there is located an epitaxial layer 13 typically comprising alternating layers of p-type gallium arsenide and aluminum arsenide each separated from its neighbor by a graded composition layer of aluminum gallium arsenide typically approximately 50 nm thick. The thickness of each such p-type gallium arsenide layer typically is approximately 30 nm, and the thickness of each such p-type aluminum arsenide typically is approximately 25 nm. The number of alternating layers of gallium arsenide and aluminum arsenide in the epitaxial layer 11 is equal to typically approximately 22 to 26 each; the number of such alternating layers in the epitaxial layer 13 is equal to typically approximately 15 to 25 each, depending on the desirability of using the ohmic electrode contact layer 17.1 (FIGS. 5 and 7) as part of the top mirror of the vertical cavity during laser operation. Each of the epitaxial layers 11 and 13 acts as a distributed Bragg reflector, as known in the art, for the optical radiation that the active region 12 will generate in during laser operation, as explained in greater detail below.

Located in the epitaxial layer 13 and contiguous with the active region 12, there is a more slowly linearly-graded composition layer of gallium arsenide and aluminum arsenide, typically having a thickness of approximately 95 nm; and located in the epitaxial layer 11 and contiguous with the active region 12, there is also a similar more slowly graded composition layer also having a thickness of approximately 95 nm.

A protective masking layer 14, typically of silicon dioxide having a thickness of approximately 700 nm, is located on top of the epitaxial layer 13. An epitaxial sidewall layer 15.2, typically of epitaxial aluminum gallium arsenide having a thickness of approximately 150 nm is located on the sidewall of the mesa. This epitaxial sidewall layer 15.2 extends onto the top surface of a laterally extended portion of the epitaxial layer 11. Thus the epitaxial layer 15.2 is located on the sidewalls of the epitaxial layers 11, 12, and 13, as well as on the top surface of the laterally extended portion of the epitaxial layer 11.

The thickness of the epitaxial sidewall layer 15.2 is typically larger on the top surface of the laterally extended portion of the substrate 10 than on the sidewall of the mesa because of the way in which it typically is made: molecular beam epitaxy in which the beam is directed at an angle to the normal to the substrate 10, as more fully described below, which favors growth on horizontal surfaces as opposed to vertical (sidewall) surfaces. Alternatively (not shown) the laterally extended portion of the epitaxial sidewall layer 15.2 directly contacts a top surface of the substrate 10—the laterally extended portion of the epitaxial layer 11 being missing, that is, the epitaxial layer 11 being confined to the mesa. Finally, a polycrystalline (non-epitaxial) layer 15.1, typically comprising aluminum gallium arsenide, is located on the top surface of the protective masking layer 14. This polycrystalline layer 15.1 is ordinarily unavoidably (but not absolutely necessarily) formed at the same time as the epitaxial sidewall layer 15.2, as more fully described below.

The epitaxial sidewall layer 15.2 advantageously is doped (typically with chromium to a concentration of approximately 1 E 16 per cubic centimeter or with oxygen to a concentration in the approximate range of 1 E 15 to 1 E 16 per cubic centimeter) to render the epitaxial sidewall layer 15.2 sufficiently electrically resistive to prevent its electrically short circuiting the active layer 12 during laser operation.

To form the structure shown in FIG. 1, the substrate is prepared with an electrical contact layer (not shown) located on its bottom surface, and this contact layer is geometrically selectively etched from those areas on the bottom surface of the substrate 10 through which the laser light is to propagate from the laser structure during its laser operation. Then the materials of the epitaxial layers 11, 12, 13 are formed by epitaxial growth in a laterally extended fashion, as known in the art. Next the material of the protective masking layer 14 is deposited, likewise in a laterally extended fashion, as known in the art.

Then the protective masking layer 14 is geometrically selectively etched, preferably anisotropically, typically by means of a standard wet or dry photolithographic etching process, whereby a (thus patterned) protective masking 14 is formed. This masking layer 14 prevents etching of that portion of the underlying epitaxial layer 13 that is masked by the protective masking layer 14. Next, the thus exposed and only the thus exposed (laterally extended) portions of the entire thickness of the materials of the epitaxial layers 13 and 12, as well as only a part of the thickness of the epitaxial layer 11, are anisotropically etched, typically by dry etching such as a standard reactive ion etching process or a standard electron cyclotron resonance plasma etching process. The thickness of the laterally extended portion of the epitaxial layer 11 is thus reduced to typically approximately 600 nm or less.

Then the epitaxial sidewall layer 15.2 and the non-epitaxial layer 15.1 are formed simultaneously—advantageously using a standard molecular beam epitaxial growth, in which the molecular beam is directed at the mesa structure at an angle of typically in the range of approximately 7° to 10° relative to the normal to the substrate while the mesa structure is rotated around its axis. Alternatively, a standard metalorganic chemical vapor deposition ("MOCVD") process can be used. A portion of the epitaxial sidewall layer 15.2 thus extends laterally over the laterally extended portion of the epitaxial layer 11. The epitaxial growth of the epitaxial layer 11, 12, 13, as well as the formation of the protective masking layer 14 and the epitaxial sidewall layer 15.2 together with the non-epitaxial layer 15.1, can all be performed in a single- or multi-chambered vacuum apparatus, as known in the art.

By patterning the protective masking layer 14 to have many mutually separated localized areas (not shown), an array of many mesa structures can thus be formed on the substrate 10. Subsequently if desired, after all the remaining steps described below have been carried out, many separated laser structures can be formed by means of such techniques as dicing, as known in the art of batch fabrication.

Figure 2:
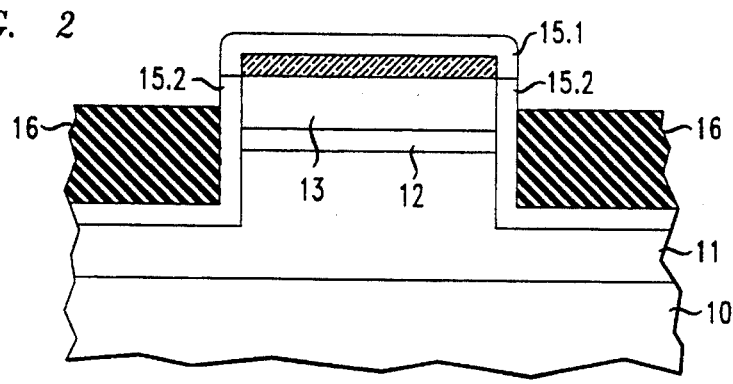

Next (FIG. 2), a photoresist (or other suitable resist) layer is formed overlying the entire structure—that is, overlying the top and side surfaces of the mesa plus the top surface of the laterally extended portion of the epitaxial sidewall layer 15.2. This photoresist layer is planarized and partially etched back by means of standard planarization and etchback techniques that typically do not attack the aluminum gallium arsenide contained in the non-epitaxial layer 15.1 or the epitaxial sidewall layer 15.2. Thus a patterned planarized photoresist layer 16 is formed.

Figure 3:
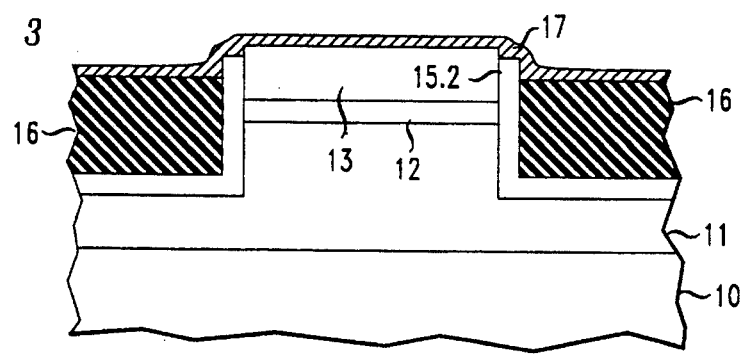

Then (FIG. 3) the non-epitaxial layer 15.1 is removed, as by a standard chlorine-based reactive ion etching process that typically does not remove the protective masking layer 14. It is useful to overetch the non-epitaxial layer 15.1 whereby a top portion of the epitaxial sidewall layer 15.2 is removed, so that the top surface of the epitaxial sidewall layer 15.2 (FIG. 3) is situated at a level below that of the top surface of the epitaxial layer 13. The protective masking is removed thereafter, typically by means of a standard fluorine-based dry etching process in case the protective masking layer 14 is silicon dioxide. Next, an ohmic contact layer 17 is formed overlying the entire structure (mesa plus photoresist). This ohmic contact layer 17, typically comprising an alloy of gold and beryllium, typically has a thickness of approximately 80 nm.

Figure 4:
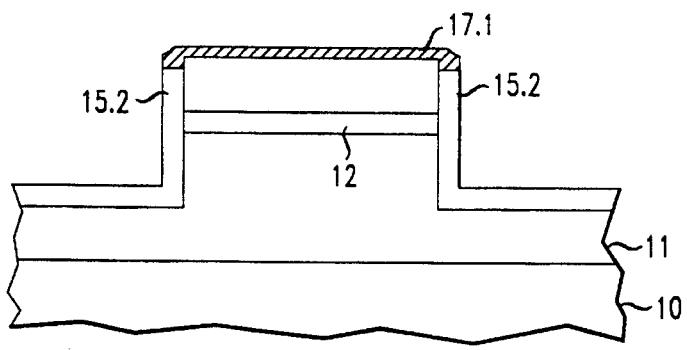

Then (FIG. 4) the photoresist layer 16 is removed, as by dissolving it in acetone, whereby the ohmic contact layer 17 is lifted off except at areas overlying the mesa structure, and thus a patterned ohmic electrode contact layer 17.1 is formed.

In case the epitaxial sidewall layer 15.2 has sufficient electrical resistivity, typically of the order of $10^8$ (=1 E8) $\Omega$-cm (i.e., sufficient to prevent undue leakage current to the substrate during laser operation), then a metallic wiring layer 18 (FIG. 5) is formed overlying the entire structure and is patterned as desired for external electrical access. This wiring layer 18 is typically made of gold having a thickness of typically 200 nm or more. At this juncture, a utilization device 50—including optical fiber(s) and lens(es) if desired, as known in the art—can be positioned to receive optical radiation 51 generated by the resulting laser structure in response to voltages applied to the wiring layer 18 and to the electrical contact layer (not shown) located on the bottom surface of the substrate 10. This utilization device 50 can take the form of an optical fiber communication system, for example.

Figure 6:
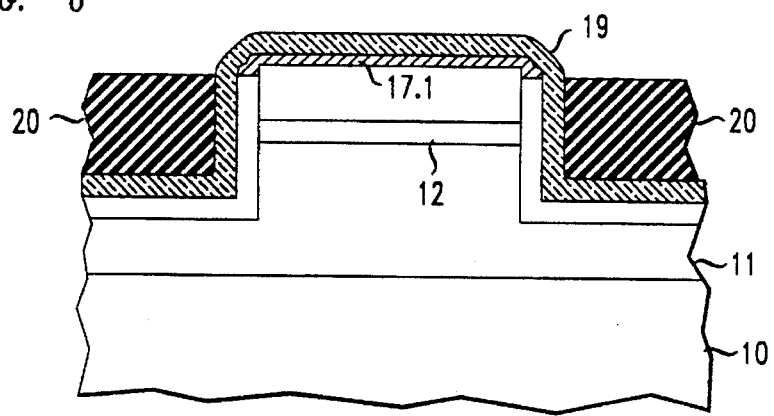
FIGS. 6–7 are cross-sectional diagrams of successive stages of another laser structure being fabricated in accordance with another specific embodiment of the invention.

In case the electrical resistivity of the epitaxial sidewall layer 15.2 is not sufficient to prevent an undesirable reduction in the efficiency of the laser, then instead of depositing the wiring layer 18 as described above in conjunction with FIG. 5 an insulating layer 19, typically silicon dioxide having a thickness of 300 nm, is formed everywhere on the surface of the structure. Another patterned planarized photoresist (or other resist) layer 20 is then formed, as indicated in FIG. 6. Next, the top surface of the (silicon dioxide) insulating layer 19 is removed (as by a fluorine-based dry etching), whereby the top surface of the patterned ohmic contact layer 17.1 (but advantageously not the top surface of the epitaxial sidewall layer 15.2) becomes exposed. Also, sidewall and laterally extended portions 19.2 and 19.1, respectively, of the original insulating layer 19 remain intact. Next, the photoresist layer 20 is dissolved completely. Then (FIG. 7) a wiring layer 21 is formed, typically having the same patterning and composition as those of the above-described wiring layer 18, whereby voltages can be applied to the structure for laser operation. Again, optical radiation 51 emitted by the structure can be collected and used by a utilization device 50.

Although the invention has been described in detail in terms of a specific embodiment, various modifications can be made without departing from the scope of the invention. For example, instead of gallium arsenide, aluminum arsenide, and aluminum gallium arsenide other Group III-V semiconductors can be used such as indium phosphide, indium gallium phosphide, aluminum indium phosphide, gallium nitride, and aluminum nitride. Instead of silicon dioxide, the protective masking layer 14 can be silicon nitride, silicon oxynitride, or any other material that can withstand the processing steps following its formation. Sinusoidally-graded compositions can be used, instead of linearly-graded compositions, in the graded layers 11 and 13. As an alternative to the structures shown in FIGS. 1–7, by prolonging the formation (by etching) of the mesa structure, there can be no laterally extended portion of the epitaxial layer 11, whereby the laterally extended portion of the epitaxial layer 15.2 intimately physically contacts a resulting exposed laterally extended portion of top surface of the substrate 10. Finally, instead of the ahoy of gold and beryllium, the ohmic electrode contact layer 17.1 can be another metal or a metal-like layer such as tungsten, gold, silver, intermetallic iron-aluminum ($Fe_3Al$), or alloys thereof.

We claim:

1. A method of making a laser comprising the steps of:
   (a) providing an epitaxial III-V semiconductor structure comprising an epitaxial III-V semiconductor mesa located on a III-V semiconductor body, the body having a laterally extended top surface, the epitaxial semiconductor mesa having a top surface on which is located a protective masking layer;
   (b) simultaneously forming an epitaxial III-V semiconductor sidewall layer on a sidewall surface of the epitaxial mesa structure, an epitaxial III-V semiconductor bottom layer on the top surface of the laterally extended top surface of the body, and a non-epitaxial III-V semiconductor top layer on a top surface of the protective masking layer;
   (c) forming a planarized patterned resist layer on the epitaxial semiconductor sidewall and epitaxial semiconductor bottom layer but not on the non-epitaxial semiconductor top layer, the planarized patterned resist layer being contiguous with the epitaxial semiconductor sidewall layer;
   (d) entirely removing first the non-epitaxial III-V semiconductor layer and then the protective masking layer from the top surface of the epitaxial semiconductor mesa without entirely removing the planarized patterned resist layer, whereby the top surface of the epitaxial semiconductor mesa is exposed;
   (e) depositing a layer comprising gold on the top surface of the epitaxial semiconductor mesa and on the top surface of the planarized patterned resist layer, followed by removing a portion of the layer comprising gold by a resist lift off process, whereby a localized layer comprising gold remains intact on the top surface of the epitaxial semiconductor mesa.

2. The method of claim 1 in which step (d) comprises reactive ion etching the non-epitaxial masking layer.

3. The method of claim 2 further comprising simultaneously depositing, subsequent to step (e), another layer comprising gold on the localized layer comprising gold, on the epitaxial sidewall layer, and on the epitaxial bottom layer.

4. The method of claim 1 further comprising simultaneously depositing, subsequent to step (e), another layer comprising gold on the localized layer comprising gold, on the epitaxial sidewall layer, and on the epitaxial bottom layer.

5. The method of claim 1 further comprising, subsequent to step (e), the steps of:
   (f) depositing an electrically insulating layer simultaneously on a surface of the localized layer comprising gold and on the epitaxial sidewall and epitaxial bottom layer;
   (g) forming a second patterned planarized resist layer on the electrically insulating layer but not on the localized layer comprising gold;
   (h) removing that portion of the electrically insulating layer that overlies the localized layer comprising gold; and
   (i) removing the second patterned planarized resist layer.

6. The method of claim 5 further comprising, subsequent to removing the second patterned resist layer, simultaneously depositing another layer comprising gold on the localized layer comprising gold, and on the epitaxial sidewall and the electrically insulating layer.

7. The method of claim 6 in which step (d) comprises reactive ion etching the non-epitaxial layer and reactive ion etching the protective layer.

8. The method of claim 5 in which step (d) comprises a reactive ion etching the non-epitaxial layer and reactive ion etching the protective layer.

* * * * *